United States Patent
Spooner et al.

(10) Patent No.: US 7,968,807 B2
(45) Date of Patent: Jun. 28, 2011

(54) PACKAGE HAVING A PLURALITY OF MOUNTING ORIENTATIONS

(75) Inventors: Timothy R. Spooner, Dunstable, MA (US); Nelson Kuan, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 527 days.

(21) Appl. No.: 11/780,894

(22) Filed: Jul. 20, 2007

(65) Prior Publication Data

US 2008/0205025 A1 Aug. 28, 2008

Related U.S. Application Data

(60) Provisional application No. 60/832,742, filed on Jul. 21, 2006.

(51) Int. Cl.
*H01L 23/495* (2006.01)

(52) U.S. Cl. ............ 174/529; 174/50.5; 174/50.52; 361/670; 361/813; 361/752

(58) Field of Classification Search ............ 174/50, 174/50.5, 50.51–50.54, 50.59, 520, 521, 174/527–529, 534–542, 549, 551, 557; 361/670.01, 361/728–733, 735, 748, 752, 784–786, 788, 361/790–792, 796, 803, 813; 257/669, 666, 257/E33.066, E23.045, E23.031, E23.042, 257/E23.043, E23.049, E23.05, E23.052, 257/E23.06, E23.066, E23.141
See application file for complete search history.

(56) References Cited

U.S. PATENT DOCUMENTS

| | | | |
|---|---|---|---|
| 4,725,244 A | 2/1988 | Chewning et al. | |
| 5,302,849 A | 4/1994 | Cavasin | 257/666 |
| 5,737,192 A * | 4/1998 | Linderman | 361/790 |
| 5,744,824 A | 4/1998 | Kousai et al. | |
| 5,889,658 A | 3/1999 | Sullivan et al. | |
| 6,013,948 A | 1/2000 | Akram et al. | |
| 6,038,130 A | 3/2000 | Boeck et al. | |
| 6,547,584 B2 | 4/2003 | Myer et al. | |
| 6,592,405 B1 | 7/2003 | Hasircoglu | |
| 6,893,574 B2 | 5/2005 | Felton et al. | |
| 7,040,922 B2 | 5/2006 | Harney et al. | |
| 7,071,545 B1 * | 7/2006 | Patel et al. | 257/686 |
| 7,138,707 B1 * | 11/2006 | Lee et al. | 257/684 |
| 7,196,404 B2 | 3/2007 | Schirmer et al. | |
| 2002/0090846 A1 | 7/2002 | Abboud | |
| 2003/0197290 A1 | 10/2003 | Crowley et al. | 257/787 |
| 2004/0163470 A1 | 8/2004 | Babala et al. | |
| 2004/0164395 A1 | 8/2004 | Kobayakawa | 257/690 |
| 2004/0169244 A1 | 9/2004 | MacGugan | |

OTHER PUBLICATIONS

Authorized Officer Pierre Favre, *International Search Report and the Written Opinion of the International Searching Authority*, International Application No. PCT/US2007/074007, Jan. 18, 2008, 9 pages.

* cited by examiner

*Primary Examiner* — Dameon E Levi
*Assistant Examiner* — Hoa C Nguyen
(74) *Attorney, Agent, or Firm* — Sunstein Kann Murphy & Timbers LLP

(57) ABSTRACT

A package apparatus has a base coupled with a lid to form a leadframe package. The package has first and second exterior surfaces with respective first and second contact patterns. The first and second contact patterns are substantially electrically identical to permit the package to be either vertically or horizontally mounted to an underlying apparatus.

19 Claims, 5 Drawing Sheets

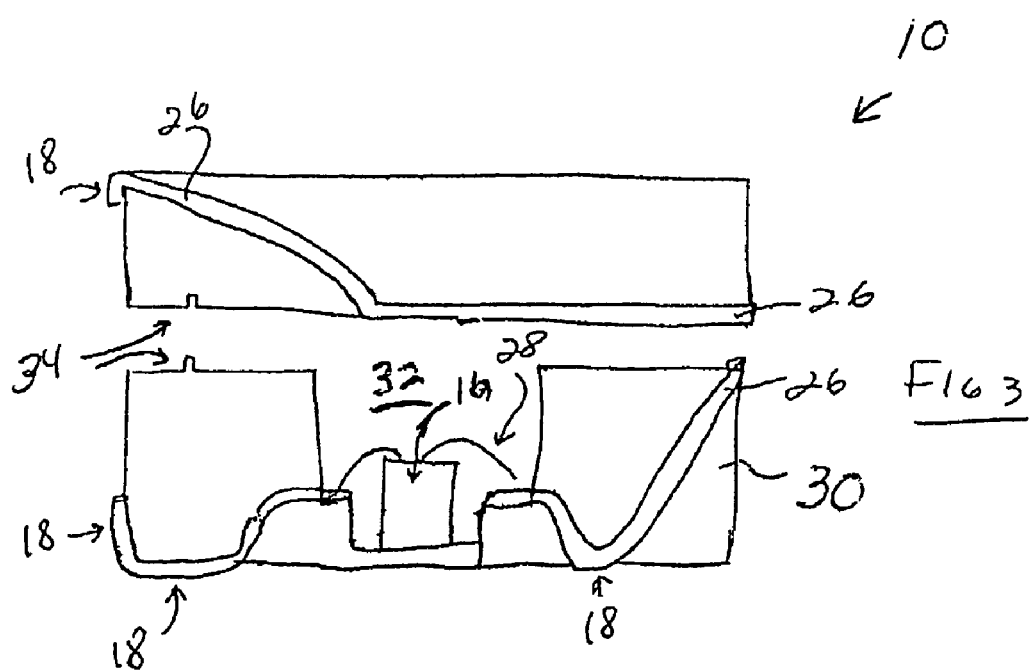

US 7,968,807 B2

PACKAGE HAVING A PLURALITY OF MOUNTING ORIENTATIONS

PRIORITY

This patent application claims priority from provisional U.S. patent application No. 60/832,742, filed Jul. 21, 2006, entitled, "PACKAGE HAVING A PLURALITY OF MOUNTING ORIENTATIONS," and naming Timothy R. Spooner and Nelson Kuan as inventors, the disclosure of which is incorporated herein, in its entirety, by reference.

FIELD OF THE INVENTION

The invention generally relates to electronic device packaging and, more particularly, the invention relates to mounting orientations of electronic packages.

BACKGROUND OF THE INVENTION

Leadframe based packages commonly are formed to be surface mounted in a horizontal orientation. Specifically, during use, the exterior package surface having the largest surface area (i.e., often referred to as the "bottom side" of the package) typically is surface mounted to a printed circuit board or other similar interconnection apparatus. There are times, however, when this mounting orientation is not optimal. For example, as known by those skilled in the art, an accelerometer often is oriented along a specific axis. As such, it generally requires a specific mounting orientation. The circuit board supporting the accelerometer therefore must be mounted within the underlying device in the correct orientation. Requiring that a circuit board be mounted in a specific orientation can be cumbersome and inefficient.

SUMMARY OF THE INVENTION

In accordance with one embodiment of the invention, a package apparatus has a base coupled with a lid to form a leadframe package. The package has first and second exterior surfaces with respective first and second contact patterns. In illustrative embodiments, the first exterior surface is in a plane that intersects the plane of the second exterior surface (e.g., the two planes are not parallel). The first and second contact patterns are substantially electrically identical to permit the package to be either vertically or horizontally mounted to an underlying apparatus.

The base and lid illustratively form a premolded leadframe package with a chamber for receiving an integrated circuit. The package apparatus also may have an integrated circuit (e.g., a MEMS device, such as an accelerometer or a gyroscope) secured within the chamber. The integrated circuit may be substantially identically electrically connected with the first contact pattern and the second contact pattern.

As premolded components, the lid and base include a moldable material. The first contact pattern may have a first plurality of contacts substantially embedded within the moldable material of at least one of the lid and base. Of course, although embedded, the contacts are exposed for mounting to an exterior apparatus. Accordingly, the moldable material does not completely encapsulate the contacts of this embodiment. In a similar manner, the second contact pattern may have a second plurality of contacts substantially embedded within the moldable material of at least one of the lid and base. In some embodiments, the first exterior surface is orthogonal to the second exterior surface.

In some embodiments, the base has a base leadframe that is in electrical contact with a leadframe embedded by moldable material of the lid. Moreover, the base may have a plurality of walls that form a chamber for receiving an integrated circuit.

In accordance with another embodiment of the invention, a method of forming a packaged integrated circuit forms at least one leadframe to have a first plurality of contacts and a second plurality of contacts. Next, the method encapsulates a portion of the at least one leadframe within a moldable material to form a base and a lid. After encapsulating, the method secures an integrated circuit to the base, and electrically connects the integrated circuit with the a least one leadframe. Specifically, the integrated circuit substantially identically electrically connects with the first plurality of contacts and the second plurality of contacts. Finally, the method connects the base to the lid to form a premolded package having first and second orthogonal, exterior surfaces. After the package is formed, the first plurality of contacts are on the first exterior surface, while the second plurality of contacts are on the second exterior surface.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

In illustrative embodiments of the invention, a premolded leadframe package has at least two, non-parallel exterior sides with substantially electrically identical contact patterns. Accordingly, such a package is capable of being mounted in at least two different orientations (e.g., on its side surface or on its bottom surface). Designers thus can orient the package to the requirements of a particular application—they no longer are limited to orienting the printed circuit board only. Details of various embodiments are discussed below.

Figure 1:
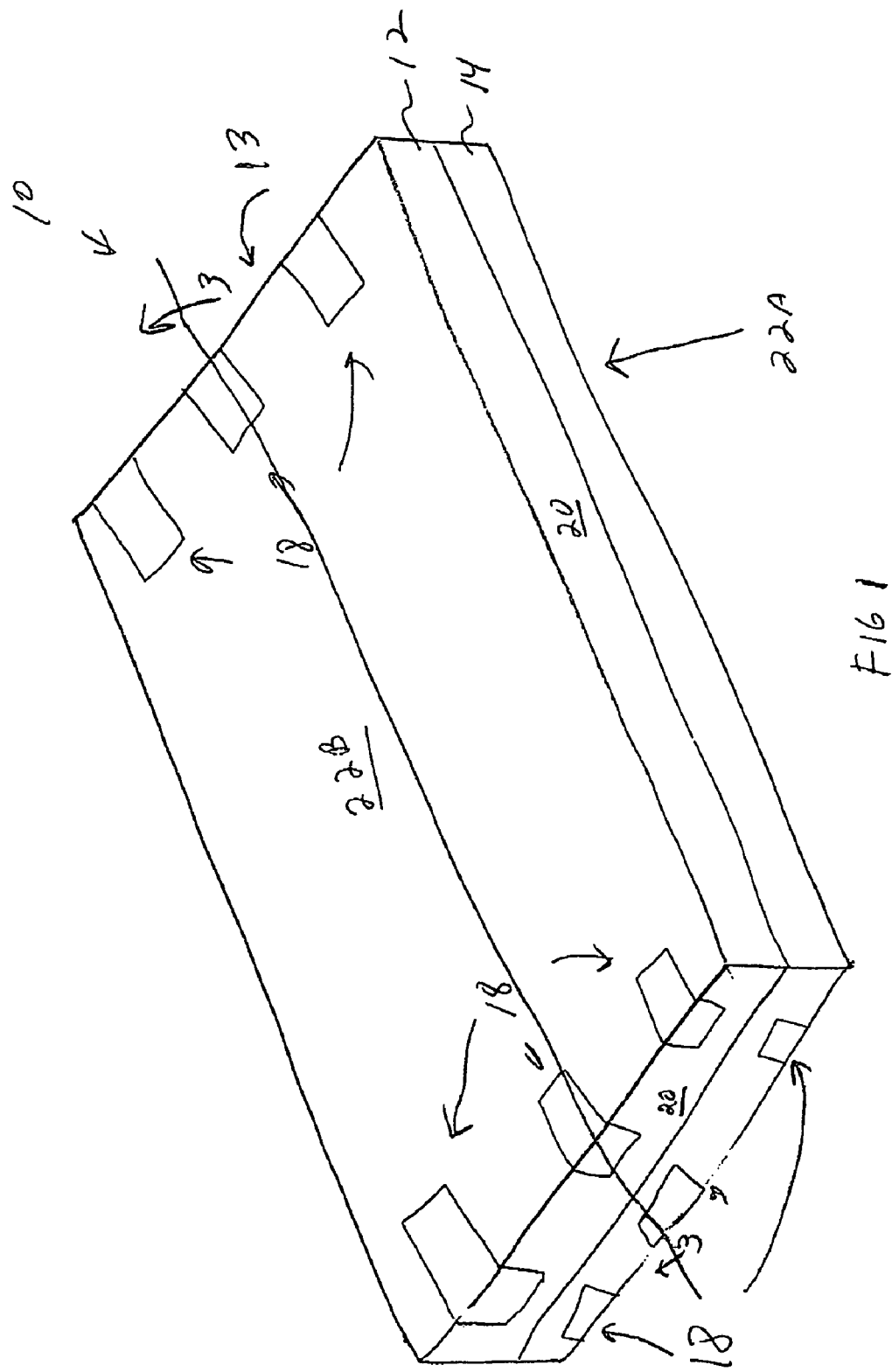
FIG. 1 schematically shows a bottom perspective view of a package configured in accordance with illustrative embodiments of the invention.

FIG. 1 schematically shows a bottom, perspective view of a packaged electronic device 10 (also referred to as a "packaged microchip 10") configured in accordance with illustrative embodiments of the invention. Among other things, the packaged electronic device 10 can contain an integrated circuit chip, such as an ASIC or a MEMS device (see FIG. 3, discussed below). For example, if a MEMS device, the packaged electronic device 10 can function as an inertial sensor, such as an accelerometer or gyroscope, or as a transducer, such as a microphone or microspeaker.

The packaged electronic device 10 shown in FIG. 1 has a base 12 that, together with a corresponding lid 14, forms a premolded leadframe package 13 for containing circuitry, such as the above noted integrated circuit chips and/or other circuitry. In a manner similar to many other types of packages, the leadframe package 13 of this embodiment has a generally rectangular cross-sectional shape with six sides; namely, a top surface 22A, a bottom surface 22B and four side surfaces 20. The top and bottom surfaces 22A and 22B have larger surface areas than those of the side surfaces 20. As shown, some of the surfaces 20, 22A, and 22B of the embodiment shown are generally orthogonal to each of their adjacent surfaces. Moreover, as discussed above and shown in FIG. 1, at least two generally nonparallel (e.g., orthogonal) surfaces 20, 22A, and 22B of the package 13 have separate but substantially electrically equivalent contact patterns (generally identified by reference number "18").

For example, one side surface 20 may have a first contact pattern 18, while the bottom surface 22B may have a second contact pattern 18. In accordance with illustrative embodiments of the invention, the first contact pattern 18 on the side surface 20 may be substantially electrically equivalent to the second contact pattern 18 on the bottom surface 22B. Among other ways, each contact (also identified by reference number "18") of the first contact pattern 18 may have a corresponding, electrically equivalent contact 18 on the second contact pattern 18. Alternatively, one contact 18 (or more contacts 18) on the first contact pattern 18 may have multiple corresponding, electrically equivalent contacts 18 on the second contact pattern 18. Accordingly, in this example, the package 13 may mount to an underlying interconnect apparatus 24 (see FIG. 4, discussed below) either on its side surface 20, or on its bottom surface 22B.

A set of one or more contacts 18 may be considered to be substantially electrically identical or equivalent with another set of one or more contacts 18 on another surface when either set may be used to make the same electrical connection with the internal circuitry of the package 13. For example, the internal chip may be a gyroscope having an output for forwarding an output signal identifying rotational movement. If this gyroscope output is electrically connected to a first set of contacts 18 on one side surface 20 of the package 13, and also to a second set of contacts 18 on the bottom surface 22B, then the first and second sets of contacts 18 each receive substantially identical electrical signals. As such, the first and second sets of contacts 18 are considered to be substantially electrically identical. Accordingly, either the bottom surface 22B or the side surface 20 may be mounted to an interconnect apparatus 24, thus providing flexibility in the mounting orientation of the package 13.

As noted above, electrical equivalence does not necessarily require a one-to-one relationship between the contacts 18 of two different sides. For example, one side of the package 13 may have a single contact 18 for forwarding a specific signal to, or receiving a specific signal from, internal package components. The package 13, however, may have two or more contacts 18 on another side for providing the same electrical connection (i.e., for forwarding or receiving the same specific signal). These two or more contacts 18 on the other side may be required to receive the entire signal (e.g., each provides a portion of the signal), or both may receive the same signal.

Accordingly, the package 13 shown in FIG. 1 may be surface mounted to a printed circuit board 24 or related apparatus on one of its side surfaces 20 (see FIG. 4, discussed below), on its bottom surface 22B, or on its top surface 22A (if it has contacts 18). The application therefore can dictate the ultimate orientation. It should be noted that the number and positioning of contacts 18 can vary depending upon application.

Illustrative embodiments use conventional surface mounting techniques to secure the package 13 to an underlying interconnect apparatus 24, such as a printed circuit board 24. Of course, other embodiments may use other techniques for securing the package 13, such as with solder balls.

To improve stability, the contacts 18 illustratively are formed as far apart as possible on a given surface. For example, the two side surfaces 20 may each have contacts 18 at or near its far corners. In some embodiments, however, the contacts 18 are not at the corners. If the contacts 18 are embedded (discussed below) and flush with the molding material, the side or surface 20, 22A or 22B may provide much of the support.

Figure 2:
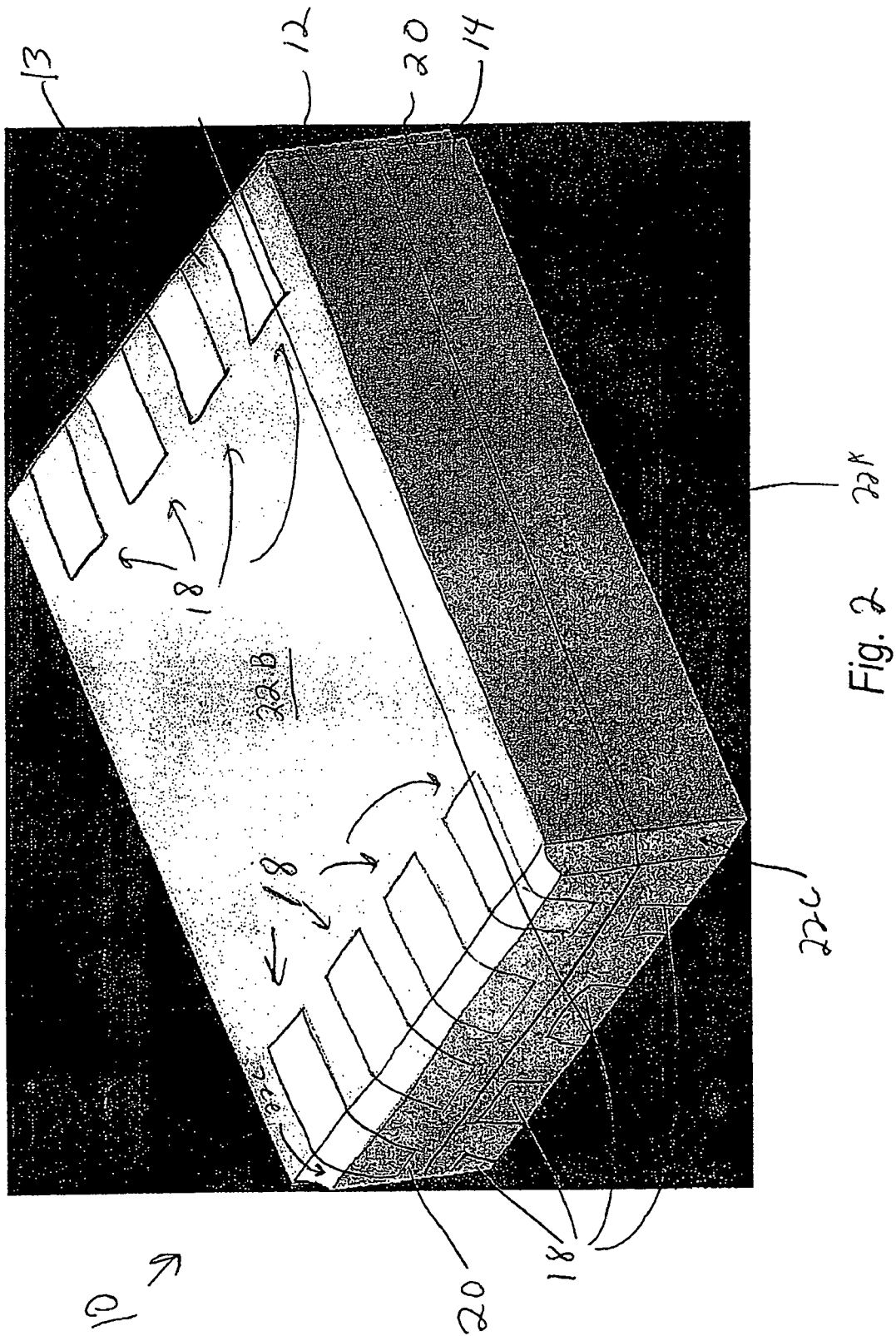
FIG. 2 schematically shows a bottom perspective view of another package configured in accordance with illustrative embodiments of the invention.

It should be noted that discussion of adjacent sides or orthogonal sides and the relationship of contact patterns 18 is illustrative of several embodiments only. Such embodiments necessarily fall under the general characterization of being two non-parallel sides. In other words, at least one side having the noted contact pattern 18 is in a plane that intersects the plane of the other side (having the electrically identical contact pattern 18). Moreover, as shown in FIG. 2, some of these non-parallel sides are not necessarily on adjacent sides (i.e., FIG. 2 shows intermediate sides 22C that are between the primary sides 20, 22A and 22B). Accordingly, discussion of adjacent sides, or orthogonal sides, is not intended to limit many other embodiments of the invention.

Figure 3:
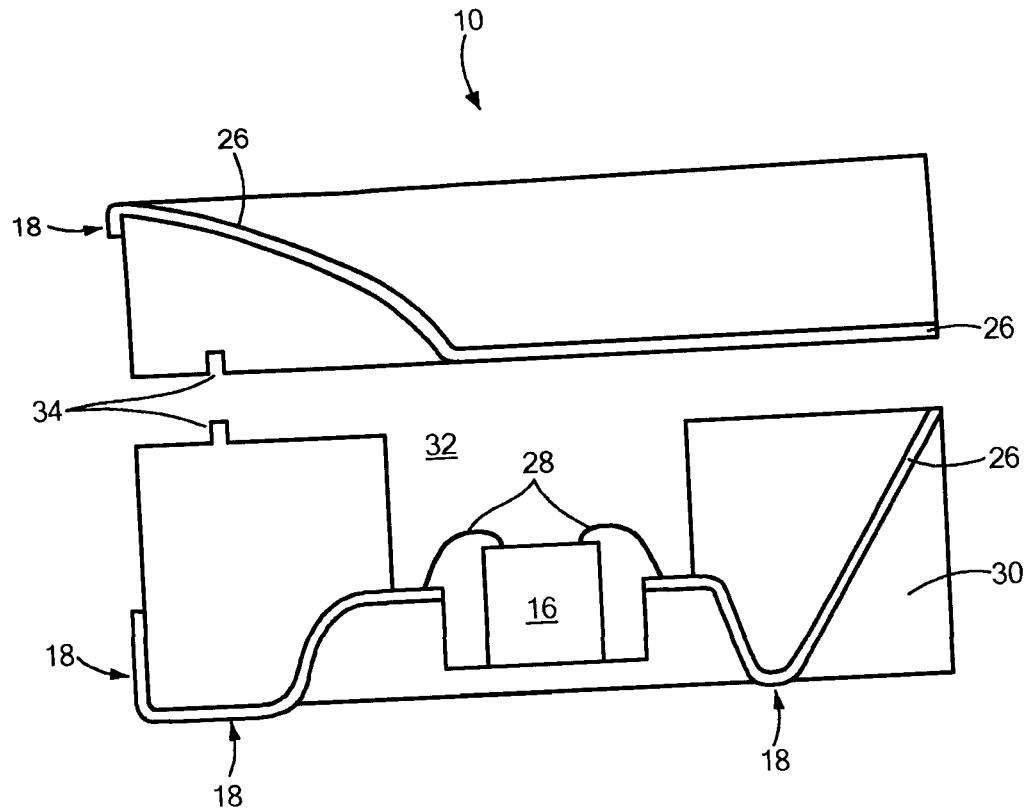
FIG. 3 schematically shows a cross-sectional, partially exploded view of the package shown in FIG. 1 along line 3-3.
Figure 4:
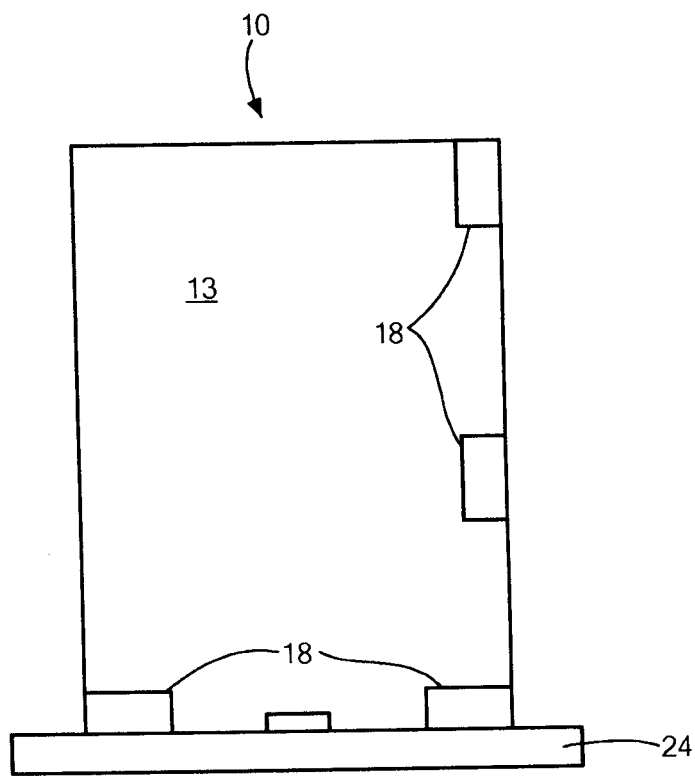
Figure 5:
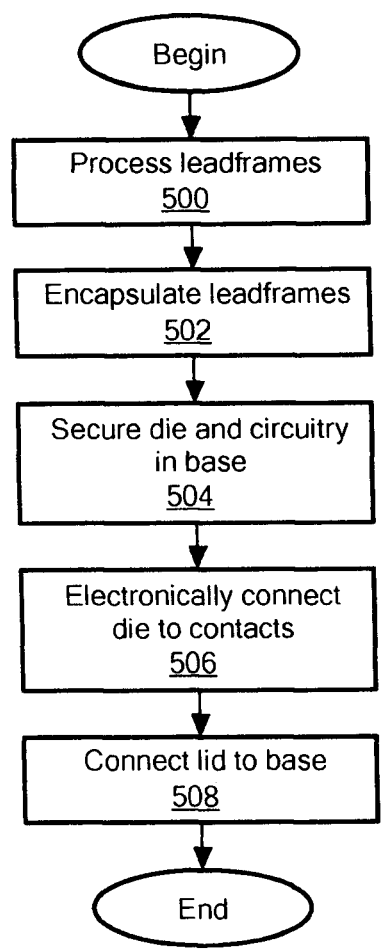

FIG. 3 schematically shows a cross-sectional, partially exploded view of the packaged electronic device 10 shown in FIG. 1 along line 3-3. This view shows an internal chamber 32 formed by coupling the lid 14 to the base 12, and the chip 16 mounted therein. Moreover, this view also shows a part of the interior leadframe(s) 26, its/their extension to the bottom and side surfaces 22B and 20, and its/their coupling to the chip 16 via wirebonds 28.

Specifically, this figure shows the interior chamber 32 containing circuitry, such as a chip 16 and/or analog circuitry. For simplicity, only the chip 16 is discussed. It nevertheless should be recognized that different circuitry (other than, or in addition to the chip 16) may be within the chamber 32.

The base 12 in this embodiment is a premolded, leadframe cavity-type base, which has four walls 30 extending generally orthogonally from a bottom, interior face to form a cavity. In a similar manner, the lid 14 also effectively is a premolded, leadframe lid. In other words, the lid 14 comprises a leadframe 26 encapsulated by molding material. Like the base 12, the lid 14 also has exposed metal forming contacts 18 and electrically connecting with the leadframe 26 of the base 12. Accordingly, this type of leadframe package 13 shown in FIG. 3 is formed from at least two leadframes 26. In alternative embodiments, however, the lid 14 does not have a leadframe.

The lid 14 secures to the top face of the walls 30 to form the interior chamber 32. To ensure a proper physical connection, one or more details 34 in the base 12 may mate with corresponding details 34 formed in the lid 14. For example, the details 34 of the base 12 may be upwardly extending protrusions, while the details 34 of the lid 14 may be corresponding orifices. As noted above, physical connection of the lid 14 and base 12 mechanically and electrically connects the leadframes 26 of the lid 14 and the base 12. The lid 14 and base 12 thus form a premolded, leadframe-type package 13 (also referred to as a "premolded package 13").

As known by those in the art, a premolded package has a moldable material (e.g., polymeric material, such as plastic) molded directly to a leadframe. Such package type generally is formed before the chip 16 is secured to it. This package type thus typically is ready to accept the chip 16 without requiring any additional molding operations. In other words, a premolded, leadframe-type package is ready made to package the electronic chip 16. This is in contrast to certain types of other plastic packages, such as "overmolded" or "postmolded" packages, which apply molten plastic to the chip 16 after it is coupled with leads of its leadframe. It nevertheless is anticipated that some embodiments can apply to post-molded and other technologies. For example, among others, some embodiments may apply to ceramic packages or stacked laminated packages using leadframes, vias, or other conductive paths to make appropriate connections.

Figure 4:
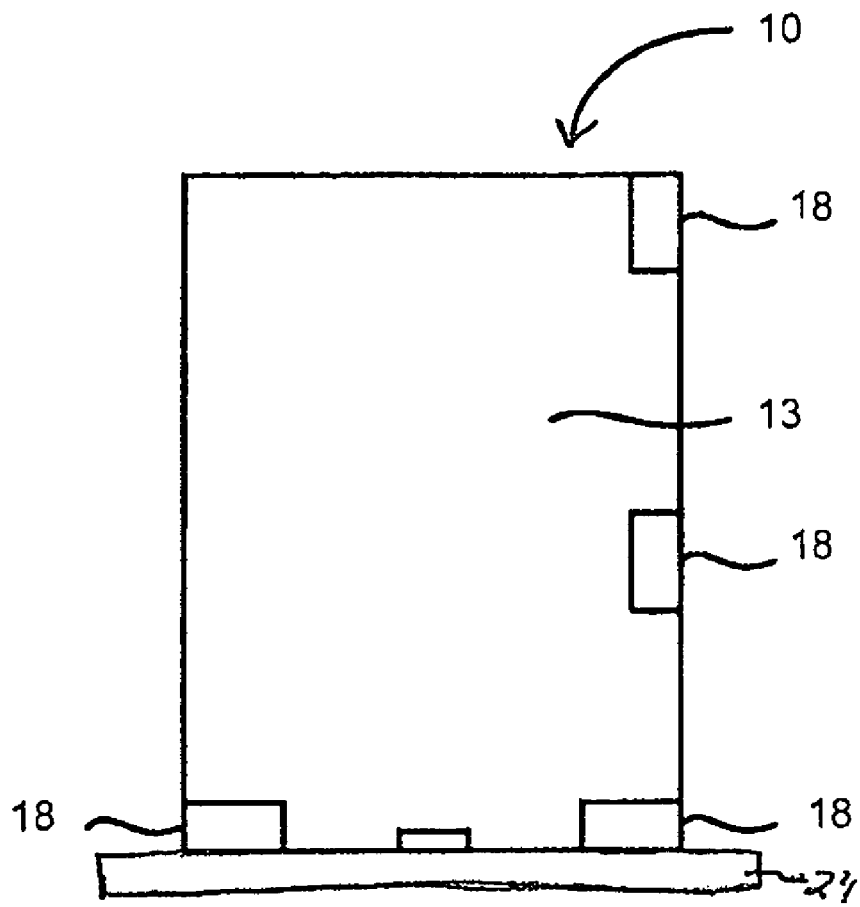
FIG. 4 schematically shows the package of FIG. 1 coupled with a printed circuit board.

FIG. 4 schematically shows the packaged microchip 10 mounted on one of its side surfaces 20 to a printed circuit board 24. As shown, to improve mechanical stability, the package 13 is coupled to the printed circuit board 24 at or near its corners. It should be noted, however, that some embodiments may mount the package 13 inwardly from its corners.

The contacts 18 may be any of a plurality of different types of contacts. Among other things, the embodiment shown in FIGS. 1-4 has pads, which are substantially embedded within the molding material of the package 13. It should be noted that the molding material does not completely encapsulate this type of contact 18—it must be partially exposed to electrically connect with an interconnect apparatus 24. For example, the contact 18 may be flush with the mold material. Alternatively, the contact 18 may be somewhat recessed within, or somewhat protruding from, the mold material. In other embodiments, however, the contacts 18 may be pins extending from the package 13.

Figure 5:
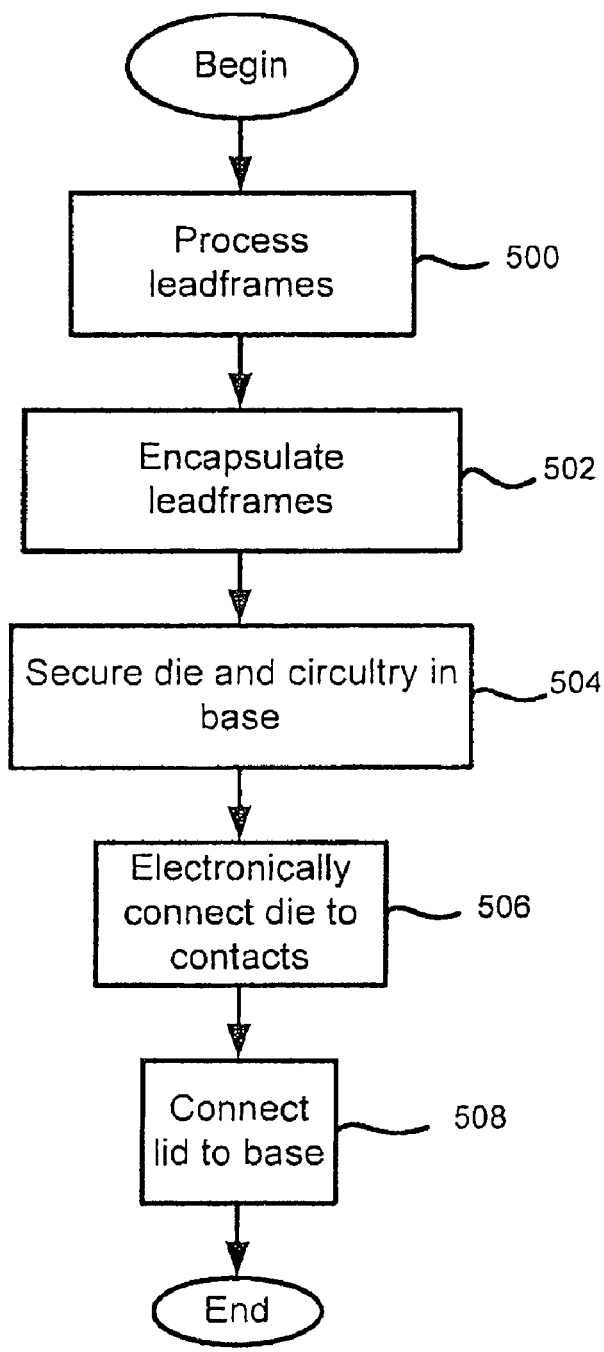
FIG. 5 shows a process of forming the packaged microchip shown in FIG. 1 in accordance with illustrative embodiments of the invention.
Figure 1:
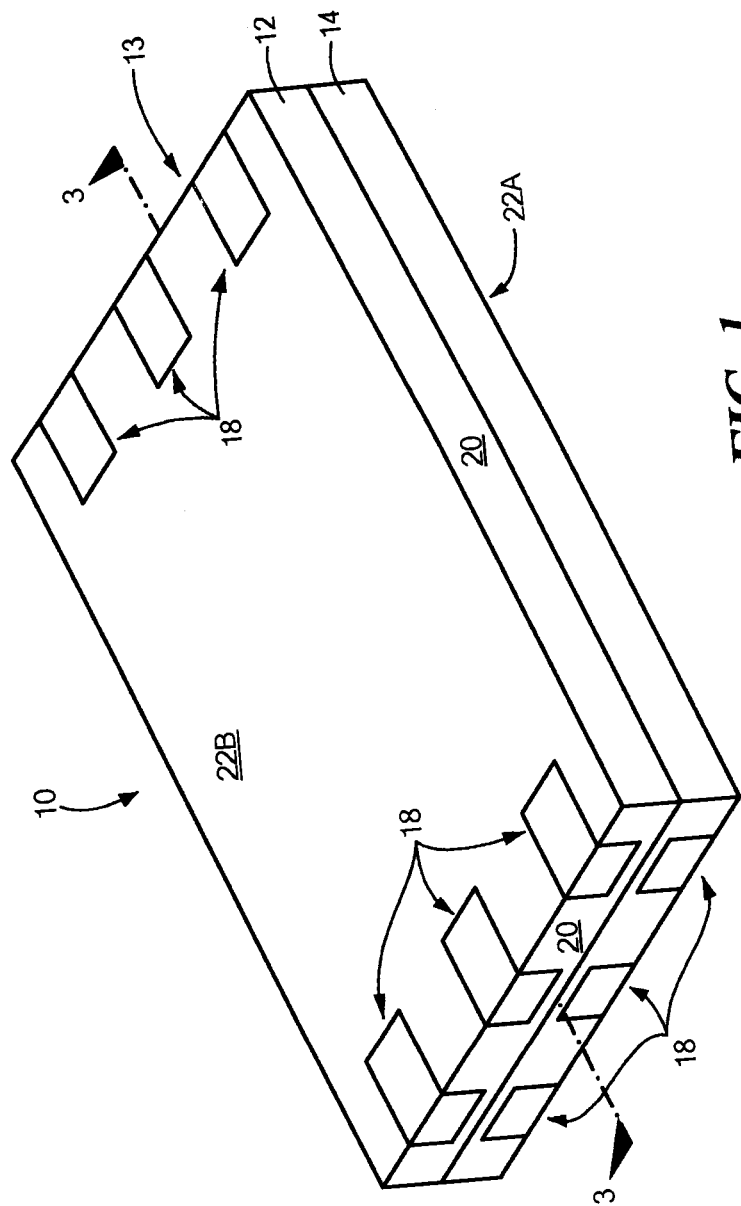
Figure 2:
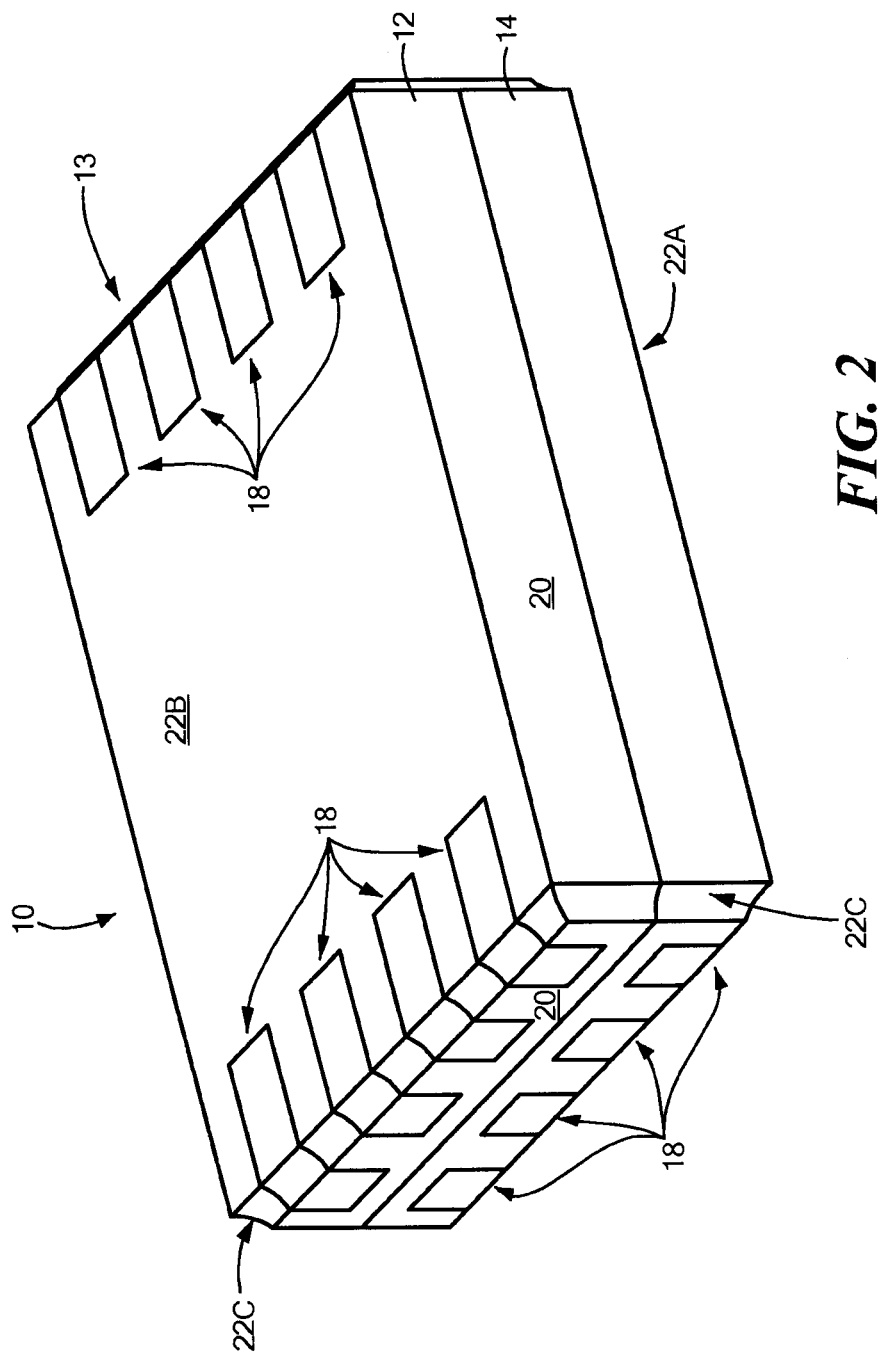

FIG. 5 shows a process of forming the packaged microchip 10 shown in FIG. 1 in accordance with illustrative embodiments of the invention. This process shows various primary steps of a much larger process. Accordingly, those in the art should understand that further steps may be added, or some of the steps shown may be modified or omitted depending upon the application.

The process begins at step 500, which processes a pair of leadframes 26. Specifically, the process stamps, etches, and/or bends, etc . . . a first leadframe 26 for use as the base 12, and a second leadframe 26 for use as the lid 14. Conventional techniques thus may form the leadframes 26 so that they have the configuration shown in FIG. 3. More particularly, as shown in FIG. 3, the leadframes 26 are formed to ensure that the ultimately package 13 has contacts 18 on at least two adjacent surfaces. In addition, the leadframes 26 also are formed to ensure proper electrical communication between the lid 14 and the base 12.

To improve fabrication efficiency, the process preferably uses batch processing techniques, which process two-dimensional arrays of leadframes 26 that ultimately are diced. For simplicity, however, the process of FIG. 5 is discussed without application of batch processing techniques.

The process continues to step 502, which encapsulates the leadframes 26 in a molding material, such as a conventional plastic. Accordingly, after completing this step, the process has formed the primary components of the leadframe package 13, which includes the lid 14 and base 12 shown in the figures.

At this point, the process may secure the die 16 and circuitry within the base 12 (step 504). For example, the die 16 may be secured with a conventional adhesive or other apparatus to a die attach pad or similar surface within the cavity of the base 12. Additional circuitry may be added, such as an application-specific integrated circuit (i.e., an ASIC) or a discrete circuit element (e.g., a capacitor).

After securing the die 16, the process electrically connects the electrical interfaces of the die 16 with the leadframe 26 of the base 12 (step 506). To that end, the process may connect the wirebonds 28 to specified portions of the leadframe 26 in the base 12. For example, in the simplified device 10 shown in FIG. 3, one wirebond 28 connects with a first lead to the left of the die 16 (from the perspective of the drawing), while another wirebond 28 connects with a second lead to the right of the die 16. The lead to the left of the die 16 effectively forms two contacts 18; namely, one contact 18 on the bottom surface 22B and another, electrically equivalent/identical contact 18 on the side surface 20. The lead to the right of the die 16 connects to another contact 18 on the bottom surface 22B and an exposed metal lead at the top of the base 12.

The process then concludes at step 508, which secures the lid 14 to the base 12. Any conventional means may be used to secure the two together, such as by using an adhesive or an ultrasonic weld. For the embodiment shown in FIG. 3, the bottom portion of the lid leadframe 26 mechanically contacts the exposed metal at the top of the base 12. This mechanical contact electrically connects the lead positioned to the right of the die 16 to a second contact 18 on the side surface 20 of the lid 14. Of course, discussion of only two contacts 18 is for simplicity only. Actual applications often can have many more contacts 18.

The premolded package 13 shown in FIG. 3 thus has substantially electrically identical contact patterns 18 on the bottom surface 22B and side surface 20. In other words, the package 13 may be horizontally mounted (i.e., mounted on its bottom surface 22B) or vertically mounted (i.e., mounted on its side surface 20, as shown in FIG. 4) to an underlying interconnect apparatus 24. Accordingly, rather than requiring a chip manufacturer to produce one packaged microchip for vertical mounting, and a second, different packaged microchip with identical functionality for horizontal mounting, various embodiments of this invention enable a single packaged microchip 10 to perform both functions.

In addition to providing more flexibility for mounting the packaged microchip 10, using leadframe package technology as discussed should significantly reduce device cost when compared to many other packaging technologies, such as ceramic package technology. Accordingly, illustrative embodiments are intended to provide a lower cost, flexible mounting solution in a number of applications.

Moreover, various embodiments permit additional uses. For example, some test handling equipment and fixturing may be configured to test horizontal parts, which are designed for horizontal mounting. For vertical mounted (packaged) microchips, however, such a test device may not suffice. Various embodiments, however, permit packaged microchips that are to be vertically mounted to be tested in a horizontal orientation.

Although the above discussion discloses various exemplary embodiments of the invention, it should be apparent that those skilled in the art can make various modifications that will achieve some of the advantages of the invention without departing from the true scope of the invention. For example, the lid 14 can form a cavity rather than, or in addition to the base 12. As another example, the package 13 can have adjacent sides/surfaces that are not substantially orthogonal (e.g., see FIG. 1), or packages having more or fewer than six sides. For example, the package 13 can have angled or curved surfaces between the top surface 22A and side surface 20. Moreover, discussion of leadframes as providing the conductive paths and contacts 18 is illustrative. For example, leadframes and other conductive members (e.g., vias) may provide appropriate connections and contacts 18. Accordingly, those in the art can modify various aspects and still achieve the various advantages of illustrative embodiments.

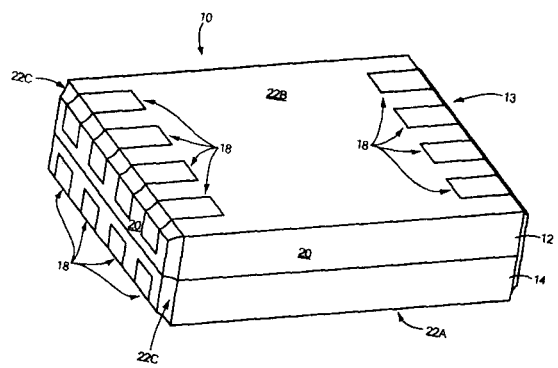

What is claimed is:

1. A package apparatus comprising:
a base;
a lid coupled with the base forming a leadframe package, the leadframe package forming a first exterior surface having a first surface area, and a second exterior surface having a second surface area less than the first surface area,
the first exterior surface forming a first contact pattern,
the first exterior surface being in a first plane that intersects the plane of the second exterior surface,
the first exterior surface characterized by a bisecting plane, the bisecting plane normal to the first plane and dividing the first exterior surface into two substantially equal, rectangular portions,
the second exterior surface forming a second contact pattern; and
a plurality of metal conductors coupling a plurality of contacts in the first contact pattern to a corresponding plurality of contacts in the second contact pattern, and the plurality of metal conductors crossing the bisecting plane, such that the first and second contact patterns are substantially electrically identical to permit the package to be either vertically or horizontally mounted to an underlying apparatus.

2. The apparatus as defined by claim 1 wherein the base and lid form a premolded leadframe package.

3. The apparatus as defined by claim 2 wherein the base and lid form a chamber for receiving an integrated circuit.

4. The apparatus as defined by claim 3, further comprising an integrated circuit mounted within the chamber, the integrated circuit being substantially identically electrically connected with the first contact pattern and the second contact pattern.

5. The apparatus as defined by claim 1 wherein the lid and base comprise a moldable material, the first contact pattern comprising a first plurality of contacts substantially embedded within the moldable material of at least one of the lid and base, the second contact pattern comprising a second plurality of contacts substantially embedded within the moldable material of at least one of the lid and base.

6. The apparatus as defined by claim 1 wherein the plurality of metal conductors comprise metal conductors in the lid.

7. The apparatus as defined by claim 1 wherein the first exterior surface is substantially orthogonal to the second exterior surface.

8. The apparatus as defined by claim 1 wherein the first exterior surface is adjacent to the second exterior surface.

9. The apparatus as defined by claim 1, further comprising:
an integrated circuit chip within the package apparatus, the integrated circuit chip having:
a first chip surface, the first chip surface having a first chip surface area;
a second chip surface opposite the first surface; and
a plurality of side surfaces between the first chip surface and the second chip surface, each of the side surfaces having a surface area less than the first chip surface area,
the first chip surface substantially parallel to the first exterior surface.

10. The apparatus as defined by claim 9, wherein the integrated circuit chip further comprises a plurality of chip contact pads, each of the plurality of chip contact pads electrically connected to a corresponding one of the plurality of conductors.

11. The apparatus as defined by claim 1, wherein the plurality of conductors couple more than half of the contacts in the first contact pattern to corresponding contacts in the second contact pattern.

12. An apparatus comprising:
a base; and
a lid coupled with the base to form a package having at least one leadframe,
the base and lid forming a plurality of exterior surfaces, including a first exterior surface having a first surface area, and a second exterior surface having a second surface area smaller than the first surface area,
the first exterior surface being orthogonal to the second exterior surface,
the first exterior surface characterized by a bisecting plane normal to the first exterior surface and dividing the first exterior surface into two substantially equal rectangular portions,
the at least one leadframe forming a first contact means on the first exterior surface, the at least one leadframe forming a second contact means on the second exterior surface, and the at least one leadframe comprising a plurality of metal conductors, the plurality of metal conductors crossing the bisecting plane and coupling the first contact means to the second contact means;
the first contact means and second contact means being substantially electrically identical to permit the package to be either vertically or horizontally mounted to an underlying apparatus.

13. The apparatus as defined by claim 12 wherein the first contact means comprises a plurality of contacts.

14. The apparatus as defined by claim 12 further comprising an electrical interconnect apparatus coupled with no more than one of the first contact means or the second contact means.

15. The apparatus as defined by claim 12 wherein the package is a premolded leadframe package.

16. The apparatus as defined by claim 15 wherein the base and lid form a chamber for receiving an integrated circuit.

17. The apparatus as defined by claim 16 further comprising an integrated circuit mounted within the chamber, the largest surface of the integrated circuit parallel to the first plane.

18. The apparatus as defined by claim 12 wherein the lid comprises a leadframe encapsulated in moldable material.

19. A package apparatus comprising:
a base, and
a lid coupled with the base forming a package,
the package forming a first exterior surface having a first surface area, and a second exterior surface having a first surface area,
the first exterior surface comprising a first plurality of contacts forming a first contact pattern, the first exterior surface characterized by a bisecting plane normal to the first exterior surface and dividing the first exterior surface into two substantially equal portions,
the second exterior surface comprising a second plurality of contacts forming a second contact pattern, the first exterior surface being in a plane that intersects the plane of the second exterior surface; and characterized by a bisecting plane normal to the plane of first exterior surface and dividing the first exterior surface into two substantially equal portions; and
a plurality of metal conductors coupling contacts in the first contact pattern to contacts in the second contact pattern, and each of the plurality of conductors crossing the bisecting plane,
the first and second contact patterns being substantially electrically identical to permit the package to be either vertically or horizontally mounted to an underlying apparatus.

* * * * *

UNITED STATES PATENT AND TRADEMARK OFFICE
CERTIFICATE OF CORRECTION

PATENT NO. : 7,968,807 B2  
APPLICATION NO. : 11/780894  
DATED : June 28, 2011  
INVENTOR(S) : Spooner et al.

Page 1 of 7

It is certified that error appears in the above-identified patent and that said Letters Patent is hereby corrected as shown below:

Title page, delete Fig. 1 and substitute Fig. 2 as shown on the attached page.

Drawings:
Delete Figs. 1-5 and substitute therefor Figs. 1-5 as shown on the attached pages.

Signed and Sealed this  
Twenty-third Day of August, 2011

David J. Kappos  
*Director of the United States Patent and Trademark Office*

(12) United States Patent
Spooner et al.

(10) Patent No.: US 7,968,807 B2
(45) Date of Patent: Jun. 28, 2011

(54) PACKAGE HAVING A PLURALITY OF MOUNTING ORIENTATIONS

(75) Inventors: Timothy R. Spooner, Dunstable, MA (US); Nelson Kuan, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 527 days.

(21) Appl. No.: 11/780,894

(22) Filed: Jul. 20, 2007

(65) Prior Publication Data
US 2008/0205025 A1    Aug. 28, 2008

Related U.S. Application Data

(60) Provisional application No. 60/832,742, filed on Jul. 21, 2006.

(51) Int. Cl.
*H01L 23/495*    (2006.01)

(52) U.S. Cl. .......... 174/529; 174/50.5; 174/50.52; 361/670; 361/813; 361/752

(58) Field of Classification Search .......... 174/50, 174/50.5, 50.51–50.54, 50.59, 520, 521, 174/527–529, 534–542, 549, 551, 557; 361/670.01, 361/728–733, 735, 748, 752, 784–786, 788, 361/790–792, 796, 803, 813; 257/669, 666, 257/E33.066, E23.045, E23.031, E23.042, 257/E23.043, E23.049, E23.05, E23.052, 257/E23.06, E23.066, E23.141
See application file for complete search history.

(56) References Cited

U.S. PATENT DOCUMENTS

| | | | |
|---|---|---|---|
| 4,725,244 A | 2/1988 | Chewning et al. | |
| 5,302,849 A | 4/1994 | Cavasin | 257/666 |
| 5,737,192 A * | 4/1998 | Linderman | 361/790 |
| 5,744,824 A | 4/1998 | Kousai et al. | |
| 5,889,658 A | 3/1999 | Sullivan et al. | |
| 6,013,948 A | 1/2000 | Akram et al. | |
| 6,038,130 A | 3/2000 | Boeck et al. | |
| 6,547,584 B2 | 4/2003 | Myer et al. | |
| 6,592,405 B1 | 7/2003 | Hasircoglu | |
| 6,893,574 B2 | 5/2005 | Felton et al. | |
| 7,040,922 B2 | 5/2006 | Harney et al. | |
| 7,071,545 B1 * | 7/2006 | Patel et al. | 257/686 |
| 7,138,707 B1 * | 11/2006 | Lee et al. | 257/684 |
| 7,196,404 B2 | 3/2007 | Schirmer et al. | |
| 2002/0090846 A1 | 7/2002 | Abboud | |
| 2003/0197290 A1 | 10/2003 | Crowley et al. | 257/787 |
| 2004/0163470 A1 | 8/2004 | Babala et al. | |
| 2004/0164395 A1 | 8/2004 | Kobayakawa | 257/690 |
| 2004/0169244 A1 | 9/2004 | MacGugan | |

OTHER PUBLICATIONS

Authorized Officer Pierre Favre, *International Search Report and the Written Opinion of the International Searching Authority*, International Application No. PCT/US2007/074007, Jan. 18, 2008, 9 pages.

* cited by examiner

*Primary Examiner* — Dameon E Levi
*Assistant Examiner* — Hoa C Nguyen
(74) *Attorney, Agent, or Firm* — Sunstein Kann Murphy & Timbers LLP

(57) ABSTRACT

A package apparatus has a base coupled with a lid to form a leadframe package. The package has first and second exterior surfaces with respective first and second contact patterns. The first and second contact patterns are substantially electrically identical to permit the package to be either vertically or horizontally mounted to an underlying apparatus.

19 Claims, 5 Drawing Sheets